United States Patent
Liu et al.

(10) Patent No.: US 11,437,158 B2
(45) Date of Patent: Sep. 6, 2022

(54) METHOD, DEVICE AND APPARATUS FOR MACHINING GROOVE OF POLOIDAL SEGMENT, AND COMPUTER-READABLE STORAGE MEDIUM

(71) Applicant: HEFEI INSTITUTES OF PHYSICAL SCIENCE, CHINESE ACADEMY OF SCIENCES, Hefei (CN)

(72) Inventors: Zhihong Liu, Hefei (CN); Haibiao Ji, Hefei (CN); Jianguo Ma, Hefei (CN)

(73) Assignee: HEFEI INSTITUTES OF PHYSICAL SCIENCE, CHINESE ACADEMY OF SCIENCES, Anhui (CN)

( * ) Notice: Subject to any disclaimer, the term of this patent is extended or adjusted under 35 U.S.C. 154(b) by 0 days.

(21) Appl. No.: 17/562,371

(22) Filed: Dec. 27, 2021

(65) Prior Publication Data
US 2022/0122746 A1 Apr. 21, 2022

(30) Foreign Application Priority Data
Oct. 19, 2021 (CN) .......................... 202111214851.2

(51) Int. Cl.
*G21C 21/00* (2006.01)
(52) U.S. Cl.
CPC .................................. *G21C 21/00* (2013.01)
(58) Field of Classification Search
CPC ......... G21C 21/00; G10D 11/00; G01D 11/30
See application file for complete search history.

(56) References Cited

U.S. PATENT DOCUMENTS

| 10,269,458 B2* | 4/2019 | Wong ........................ G21B 1/05 |
| 2010/0063344 A1* | 3/2010 | Kotschenreuther ...... G21B 1/01 |
| | | 588/311 |
| 2010/0246740 A1* | 9/2010 | Kotschenreuther .... G21B 1/057 |
| | | 376/146 |
| 2011/0013738 A1* | 1/2011 | Kotschenreuther ...... H05H 3/06 |
| | | 376/158 |
| 2011/0170648 A1* | 7/2011 | Kotschenreuther .... G21B 1/057 |
| | | 376/133 |
| 2012/0014491 A1* | 1/2012 | Deeth .................... G21B 3/008 |
| | | 376/103 |
| 2020/0338639 A1* | 10/2020 | Friesth .............. H01M 8/04074 |

FOREIGN PATENT DOCUMENTS

| CN | 106767973 A | 5/2017 |
| CN | 108237155 A | 7/2018 |

* cited by examiner

*Primary Examiner* — Lawrence Averick (57) ABSTRACT

This application relates to manufacturing of vacuum chambers of nuclear fusion reactors, and more particularly to a method, device and apparatus for machining grooves of poloidal segments of a vacuum chamber of a nuclear fusion reactor, and a computer-readable storage medium. The method includes: collecting three-dimensional (3D) point cloud data of surfaces of individual poloidal segments of the vacuum chamber; performing reverse model reconstruction, based on the three-dimensional point cloud data, to generate an actual 3D model to acquire a sectional view of the vacuum chamber; extracting a cross-reconstruction region between two adjacent poloidal segments; and calculating a target machining allowance of individual poloidal segments according to the cross-reconstruction region and a preset segment boundary to generate a machining strategy for the groove of individual poloidal segments.

5 Claims, 4 Drawing Sheets

METHOD, DEVICE AND APPARATUS FOR MACHINING GROOVE OF POLOIDAL SEGMENT, AND COMPUTER-READABLE STORAGE MEDIUM

CROSS-REFERENCE TO RELATED APPLICATIONS

This application claims the benefit of priority from Chinese Patent Application No. 202111214851.2, filed on Oct. 19, 2021. The content of the aforementioned application, including any intervening amendments thereto, is incorporated herein by reference in its entirety.

TECHNICAL FIELD

This application relates to manufacturing of vacuum chambers of nuclear fusion reactors, and more particularly to a method, device and apparatus for machining a groove of poloidal segments of a vacuum chamber of a fusion reactor, and a computer-readable storage medium.

BACKGROUND

A vacuum chamber of a nuclear fusion reactor is generally divided into eight 45° sector regions (each accounting for ⅛ of the vacuum chamber) along a circumferential direction. These ⅛ sector regions are separately fabricated and then transported to the assembly site to be assembled into a 360° toroidal vacuum chamber, where each ⅛ sector region is composed of two symmetrical 1/16 sector regions; each 1/16 sector region is composed of two symmetrical 1/32 sector regions; and each 1/32 sector region is divided into four poloidal segments along a poloidal direction.

However, the existing manufacturing process of poloidal segments generally struggles with large forming and assembly errors, and obvious welding deformation, such that the machining allowance of the poloidal segments cannot be accurately determined, greatly lowering the machining precision of welding grooves.

SUMMARY

An object of the present disclosure is to provide a method, device, and apparatus for machining a groove of a poloidal segment of a vacuum chamber in a nuclear fusion reactor, and a computer-readable storage medium to overcome the defects in the prior art that it fails to ensure the machining precision of welding grooves since the machining allowance of the poloidal segments cannot be accurately determined during the fabrication process.

Technical solutions of the present disclosure are described as follows.

In a first aspect, the present disclosure provides a method for machining a groove of poloidal segments of a vacuum chamber of a fusion reactor, comprising:

collecting three-dimensional (3D) point cloud data of a surface of individual poloidal segments of the vacuum chamber of the fusion reactor;

performing a reverse model reconstruction, based on the three-dimensional point cloud data, to generate an actual 3D model of the vacuum chamber of the fusion reactor; and acquiring a sectional view of the vacuum chamber of the fusion reactor according to the actual 3D model; and extracting a cross-reconstruction region between two adjacent poloidal segments from the sectional view; calculating a target machining allowance of each of the poloidal segments according to the cross-reconstruction region and a preset segment boundary; generating a machining strategy for a groove of each of the poloidal segments according to the target machining allowance and a target groove size; and machining the groove of each of the poloidal segments by using the machining strategy.

In some embodiments, the step of "calculating a target machining allowance of each of the poloidal segments according to the cross-reconstruction region and a preset segment boundary" is performed through steps of:

calculating a total machining allowance based on an area of the cross-reconstruction region;

if the preset segment boundary locates in the cross-reconstruction region, calculating an area ratio of two sub-regions divided by the preset segment boundary in the cross-reconstruction region; and calculating the target machining allowance of each of the poloidal segments according to the area ratio and the total machining allowance; and if the preset segment boundary is outside the cross-reconstruction region, distributing the total machining allowance according to a preset distribution strategy to obtain the target machining allowance of each of the poloidal segments.

In some embodiments, the step of "generating a machining strategy for each of the poloidal segments according to the target machining allowance and a target groove size" is performed through steps of:

calculating a difference between actual machining allowances of adjacent poloidal segments;

if the difference is greater than a preset value, correcting the preset segment boundary according to the difference; wherein a corrected preset segment boundary is close to a poloidal segment with a larger actual machining allowance; and generating a groove machining parameter of each of the poloidal segments according to the corrected preset segment boundary and the target groove size; wherein a portion to be cut at an end face of one poloidal segment with a larger actual machining allowance is larger than a portion to be cut at an end face of the other poloidal segment with a smaller actual machining allowance.

In some embodiments, the step of "collecting three-dimensional (3D) point cloud data of a surface of individual poloidal segments of a vacuum chamber of a fusion reactor" is performed through steps of:

taking a coordinate system of a laser tracker as a first 3D coordinate system; and collecting a 3D point cloud data of a side face of each of the poloidal segments under the first 3D coordinate system; wherein the surface of individual poloidal segments is composed of an end face and the side face;

collecting a 3D point cloud data of the end face of each of the poloidal segments by using a measuring arm; and converting the 3D point cloud data of the end face of each of the poloidal segments to the first 3D coordinate system according to a common reference point calibrated between the measuring arm and the laser tracker.

In some embodiments, the step of "performing reverse model reconstruction, based on the three-dimensional point cloud data, to generate an actual 3D model of the vacuum chamber of the fusion reactor" is performed through steps of:

establishing a second 3D coordinate system in a design software; and generating an ideal 3D model of the vacuum chamber of the fusion reactor in the design software;

performing relationship matching between the 3D point cloud data of the surface of each of the poloidal segments and the ideal 3D model until a relationship matching result meets a target convergence accuracy to obtain an optimal fitting relationship between the 3D point cloud data of the surface of each of the poloidal segments and the ideal 3D model; and converting the 3D point cloud data of the surface of each of the poloidal segments to the second 3D coordinate system according to the optimal fitting relationship; and performing model reverse reconstruction on each of the poloidal segments under the second 3D coordinate system to generate the actual 3D model of the vacuum chamber of the fusion reactor.

In a second aspect, the present disclosure provides a device for machining a groove of poloidal segments of a vacuum chamber of a fusion reactor, comprising:

an acquisition module;
a reconstruction module; and
a processing module;

wherein the acquisition module is configured to acquire a 3D point cloud data of a surface of each of the poloidal segments; the reconstruction module is configured to perform model reverse reconstruction based on the 3D point cloud data to generate an actual 3D model of the vacuum chamber of the fusion reactor and obtain a sectional view of the vacuum chamber of the fusion reactor according to the actual 3D model; and the processing module is configured to extract a cross-reconstruction region between adjacent poloidal segments from the sectional view, calculate a target machining allowance of each of the poloidal segments according to the cross-reconstruction region and a preset segment boundary, and generate a machining strategy for each of the poloidal segments according to the target machining allowance and a target groove size to machine the groove of each of the poloidal segments.

In some embodiments, the processing module comprises a distribution unit and a generation unit;

wherein the distribution unit is configured to calculate a total machining allowance based on an area of the cross-reconstruction region; the distribution unit is also configured to calculate an area ratio of two sub-regions in the cross-reconstruction region divided by the preset segment boundary if the preset segment boundary locates in the cross-reconstruction region, and calculate the target machining allowance of each of the poloidal segments according to the area ratio and the total machining allowance; and the distribution unit is also configured to distribute the total machining allowance according to a preset distribution strategy if the preset segment boundary is outside the cross-reconstruction region to obtain the target machining allowance of each of the poloidal segments; and the generation unit is configured to calculate a difference between actual machining allowances of adjacent poloidal segments; the generation unit is also configured to correct the preset segment boundary according to the difference if the difference is greater than a preset value, wherein a corrected preset segment boundary is close to a poloidal segment with a larger actual machining allowance; the generation unit is also configured to generate a groove machining parameter of each of the poloidal segments according to the corrected preset segment boundary and the target groove size of each of the poloidal segments; wherein a portion to be cut on an end face of one poloidal segment with a larger actual machining allowance is larger than a portion to be cut on an end face of the other poloidal segment with a smaller actual machining allowance.

In some embodiments, the acquisition module is also configured to collect a 3D point cloud data of a side face of each of the poloidal segments under a first 3D coordinate system, wherein the first 3D coordinate system is a coordinate system of a laser tracker; the surface of each of the poloidal segments is composed of an end face and the side face; and the reconstruction module is configured to establish a second 3D coordinate system in a design software, generate an ideal 3D model of the vacuum chamber of the fusion reactor in the design software, perform relationship matching between the 3D point cloud data of the surface of each of the poloidal segments and the ideal 3D model until a relationship matching result meets a target convergence accuracy to obtain an optimal fitting relationship between the 3D point cloud data of the surface of each of the poloidal segments and the ideal 3D model, convert the 3D point cloud data of the surface of each of the poloidal segments to the second 3D coordinate system by using the optimal fitting relationship, and perform model reverse reconstruction on each of the poloidal segments under the second 3D coordinate system to generate the actual 3D model of the vacuum chamber of the fusion reactor.

In a third aspect, the present disclosure provides an apparatus, comprising:

a processor;
a memory; and
a computer program;

wherein the computer program is stored in the memory, and is configured to be executable on the processor; and the processor is configured to execute the computer program to implement the method for machining a groove of poloidal segments of a vacuum chamber of a fusion reactor.

In a fourth aspect, the present disclosure provides a computer-readable storage medium, wherein the computer-readable storage medium stores a computer program; and the computer program is configured to be executed by a processor to implement the method for machining a groove of poloidal segments of a vacuum chamber of a fusion reactor.

Compared to the prior art, the present disclosure has the following beneficial effects.

In the method provided herein, the actual 3D model of the vacuum chamber of the fusion reactor obtained by reverse model reconstruction can contribute to accurately determining the machining allowance of individual poloidal segments to achieve the secondary distribution of the machining allowance. Moreover, the groove can be redesigned according to the machining allowance of the poloidal segment to eliminate the effect of contour error on the machining precision during the manufacturing process of the poloidal segments, which can effectively improve the machining precision of groove welding.

Additional aspects and advantages of this application will be provided partially below, some of which will become apparent from the following description or will be known from the implementation of this application.

BRIEF DESCRIPTION OF THE DRAWINGS

The above and/or additional aspects and advantages of this application will become apparent and easily understood from the following description of embodiments combined with the accompanying drawings.

DETAILED DESCRIPTION OF EMBODIMENTS

Embodiments of this application will be described in detail below with reference to the accompanying drawings. The identical or similar reference numerals represent identical or similar elements or elements having the same or similar functions. The embodiments described below are merely illustrative and intended to explain this application, and should not be understood as a limitation to this application.

The Tokamak device is considered as the most basic and promising toroidal plasma magnetic confinement nuclear fusion device. The Tokamak device includes a magnetic system, a vacuum chamber, a vacuum system, a blanket system, a divertor system, a power system, a refrigeration system, and a diagnostic system. The vacuum chamber is the heart of the Tokamak device, and the design, material, manufacturing, assembling, sealing and the required ultra-vacuum condition of the vacuum chamber all directly affect the discharge quality of the plasma.

Currently, the vacuum chamber of the existing nuclear fusion reactor usually has a double-shell structure with a D-shaped section. For example, the D-shaped section is 15 m in height; the maximum circumferential diameter of the equatorial plane is 25.5 m, and the minimum circumferential diameter is 7.2 m; the shell is made of ultra-low carbon stainless steel material with a thickness of 50 mm and has a total weight of 5600 tons. Given the transportation restrictions and modular assembly, the vacuum chamber is commonly divided into eight 45° sector regions along a toroidal direction, and after fabricated, the eight 45° sector regions are transported to the final assembly site to be assembled into a 360° toroidal vacuum chamber. The existing technical requirements for the ⅛ sector region are mainly described as follows.

(1) All main welds shall be fully penetrated, and the weld defect grade shall meet the requirements of ISO 5817:2003B (arc welding) or GB/T 22085.2-2008 (electron beam welding).

(2) All welds shall pass 100% nondestructive examination.

(3) The tolerance of the overall size should be controlled within ±8 mm. The surface roughness of inner and outer shells is Ra3.2. The leakage rate should be no more than $1.0*10^{-8}$ Pa·m·s$^{-1}$.

These technical requirements pose great technical challenges for the shell forming, sub-component manufacturing, welding deformation control and assembly.

The ⅛ sector region is divided into a series of functional modules from bottom to top, where the functional modules are relatively independent, universal, and interchangeable. The ⅛ sector region is formed through selection and combination of the functional modules. The ⅛ sector region is composed of two symmetric 1/16 sector regions, and the 1/16 sector region is composed of two symmetric 1/32 sector regions. The 1/32 sector region is divided into four poloidal segments along a poloidal direction. According to the tolerance allocation, the contour deviation of the 1/16 sector region is ±6 mm; the contour deviation of the 1/32 sector region is ±4 mm; and the contour deviation of the poloidal segments is ±3 mm.

Before the four poloidal segments are assembled and welded into the 1/32 sector region, the welding grooves need to be machined with a machining precision superior to 0.5 mm. However, there are still the following technical difficulties in the groove machining of the poloidal segment in the prior art.

(1) In the manufacturing process, the accumulation of forming errors, assembly errors, and welding deformation will cause the contour deviation of the poloidal segment, which will further affect the machining precision of welding grooves.

(2) The machining allowance of the end face of poloidal segment cannot be distributed unevenly, and the machining allowances of some end faces are negative, which requires a secondary allocation.

A method, device, and apparatus for machining a groove of a poloidal segment of a vacuum chamber of a fusion reactor, and a computer-readable storage medium will be described with reference to the drawings below. Concerning that the machining allowance of the poloidal segment cannot be accurately determined during machining, which greatly reduces the machining precision of groove welding, this application provides a method for machining a groove of a poloidal segment of a vacuum chamber in a nuclear fusion reactor. In the method provided herein, the actual 3D model of the vacuum chamber of the fusion reactor obtained by reverse model reconstruction can contribute to accurately determining the machining allowance of individual poloidal segments to achieve the secondary distribution of the machining allowance. Moreover, the groove can be redesigned according to the machining allowance of the poloidal segment to eliminate the effect of contour errors on the machining precision during the manufacturing process of poloidal segments, which can effectively improve the machining precision of groove welding.

Figure 1:
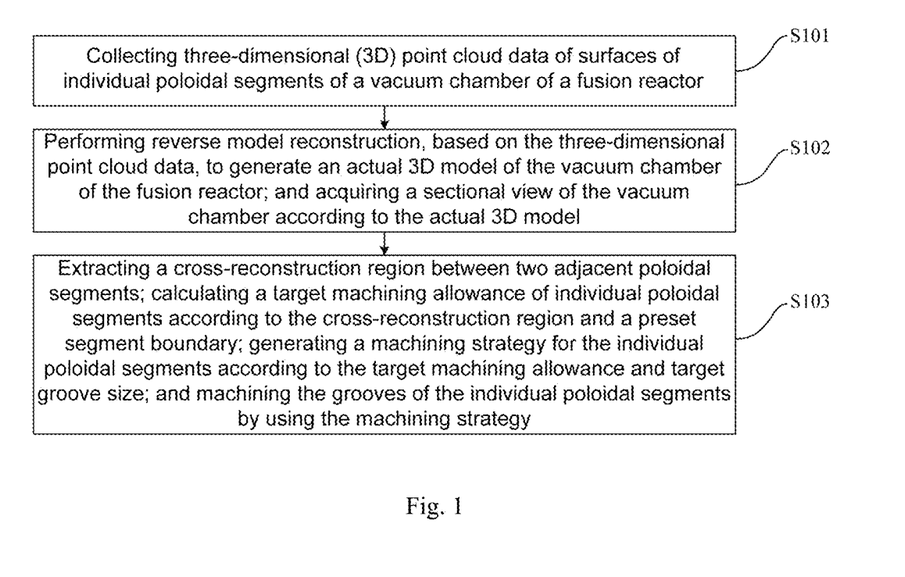
FIG. 1 is a flow chart of a method for machining a groove of poloidal segments of a vacuum chamber of a fusion reactor according to an embodiment of the present disclosure.

FIG. 1 is a flow chart of a method for machining grooves of poloidal segments of a vacuum chamber of a nuclear fusion reactor according to an embodiment of this application.

As shown in FIG. 1, the method includes the following steps.

(S101) A 3D point cloud data of a surface of individual poloidal segments of the vacuum chamber of the fusion reactor are collected.

Figure 2:
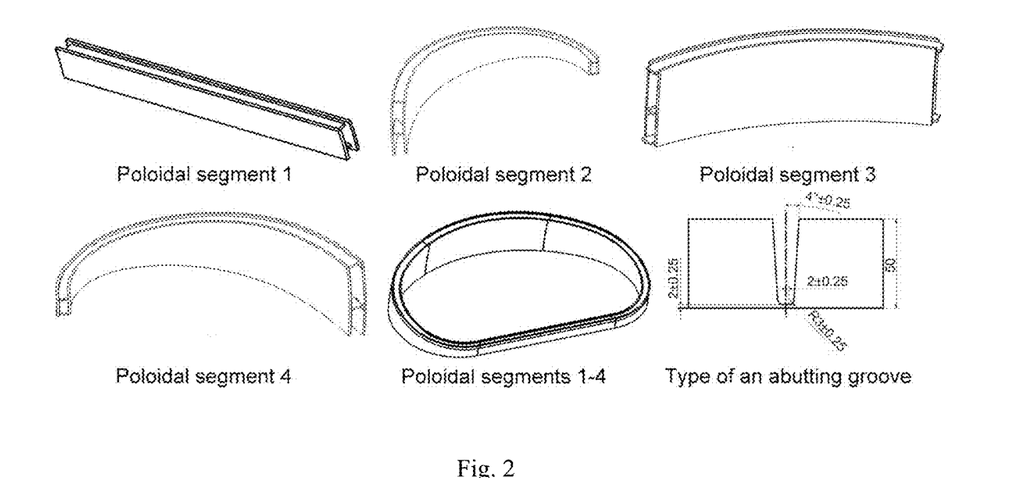
FIG. 2 schematically illustrates a poloidal segment model according to an embodiment of the present disclosure.

The surfaces of each of the poloidal segments is composed of end faces and side faces. As shown in FIG. 2, four poloidal segments of a 1/32 sector region are illustrated. The butt surfaces between adjacent poloidal segments are the end faces, and the other faces are the side faces.

In this embodiment, the step (S101) includes the following steps.

A coordinate system of a laser tracker is taken as a first 3D coordinate system, and a 3D point cloud data of a side face of each of the poloidal segments is collected under the first 3D coordinate system. A 3D point cloud data of the end face of each of the poloidal segments is collected by using a measuring arm and are converted to the first 3D coordinate system according to a common reference point calibrated between the measuring arm and the laser tracker.

The first 3D coordinate system is the real space coordinate system of the laser tracker.

It should be understood that in this embodiment, a set of common reference points are measured, combined with the laser tracker and a measuring arm with flexible joint coordinates to collect the 3D point cloud data on the surface of each of the poloidal segments. The laser tracker can collect points evenly due to its wide measurement range, and the measuring arm with the flexible joint coordinates can obtain the 3D point cloud data of the end face of each of the poloidal segments by laser scanning, which can effectively improve the convenience and efficiency of data collection.

Figure 3:
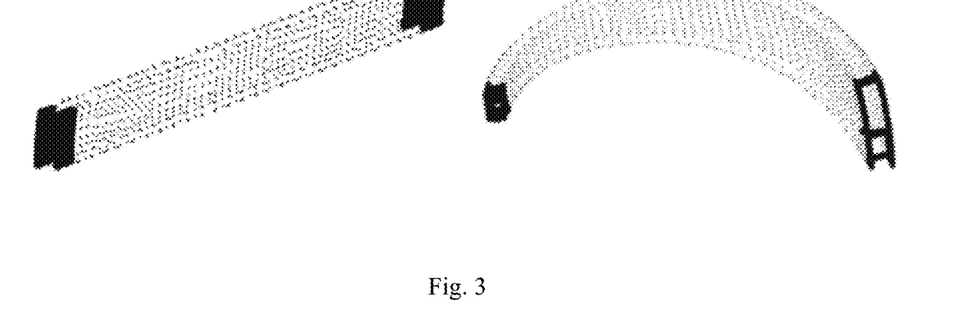
FIG. 3 schematically illustrates 3D point cloud data of the poloidal segments of the vacuum chamber of the fusion reactor according to an embodiment of the present disclosure.

In the process of data collection, any points of the laser tracker is the center to establish the first 3D coordinate system. The point cloud data obtained by the measuring arm with the flexible joint coordinates is converted to the first 3D coordinate system through common reference point conversion to obtain the 3D point cloud data of the surface of each of the poloidal segments under the same 3D coordinate system, as shown in FIG. 3.

(S102) A reverse model reconstruction is performed to generate an actual 3D model of the vacuum chamber of the fusion reactor and acquire a sectional view of the vacuum chamber of the fusion reactor according to the actual 3D model.

In this embodiment, the reverse model reconstruction can be performed through many methods, such as a method based on a CATIA V5R20 software reverse engineering module, which is not limited specifically.

Figure 4:
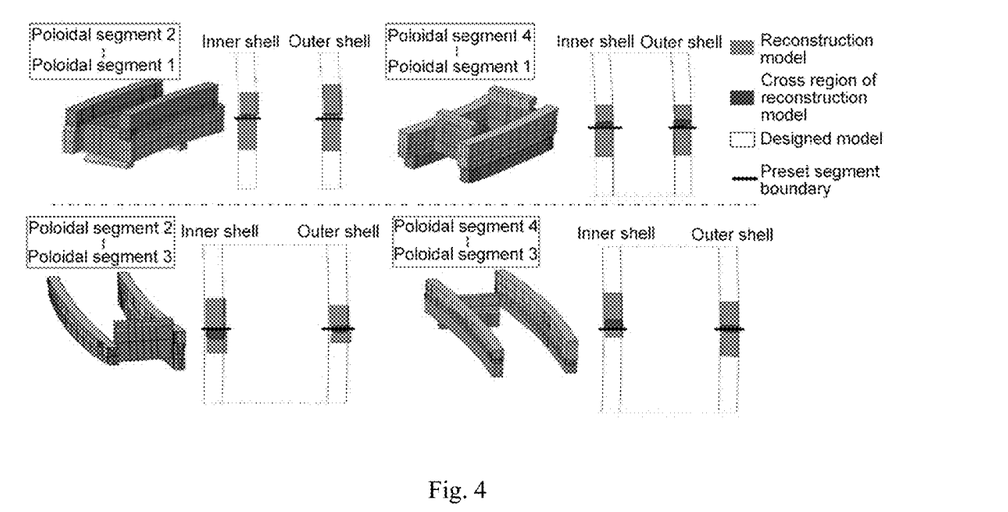
FIG. 4 schematically shows comparison of a partial section of end faces between an actual 3D model and an ideal 3D model according to an embodiment of the present disclosure.

It can be understood that the actual 3D model of the vacuum chamber of the fusion reactor can be obtained by reverse model reconstruction, and the sectional view of the vacuum chamber of the fusion reactor can be obtained by the sectional view of the actual 3D model, where the sectional view includes a local sectional view, through which the two-dimensional diagram shown in FIG. 4 can be generated.

In this embodiment, the step "A reverse model reconstruction is performed to generate an actual 3D model of the vacuum chamber of the fusion reactor" is performed though the following steps.

A second 3D coordinate system is established in a design software, and an ideal 3D model of the vacuum chamber of the fusion reactor is generated in the design software. Relationship matching is performed between the 3D point cloud data of the surface of each of the poloidal segments and the ideal 3D model until a relationship matching result meets a target convergence accuracy to obtain an optimal fitting relationship between the 3D point cloud data of the surface of each of the poloidal segments and the ideal 3D model. The 3D point cloud data of the surface of each of the poloidal segments are converted to the second 3D coordinate system according to the optimal fitting relationship. The reverse model reconstruction is performed on each of the poloidal segments under the second 3D coordinate system to generate the actual 3D model of the vacuum chamber of the fusion reactor.

The second 3D coordinate system is a virtual coordinate system established in the design software. The design software can be selected according to actual needs, such as the Spatial Analyzer software. The ideal 3D model refers to the design model obtained by using the design software, such as the computer-aided design (CAD) model.

The step (102) is performed specifically as follows.

(1) By using the design software, and based on the principle of least square, the optimal fitting is performed on the contour data of each of the poloidal segments and the ideal 3D model of each of the poloidal segments to solve the space conversion relationship, where the optimal fitting refers to the relationship matching between the measured data and the designed model to obtain the optimal solution, and the relationship matching is performed until the result meets a certain convergence accuracy.

Figure 5:
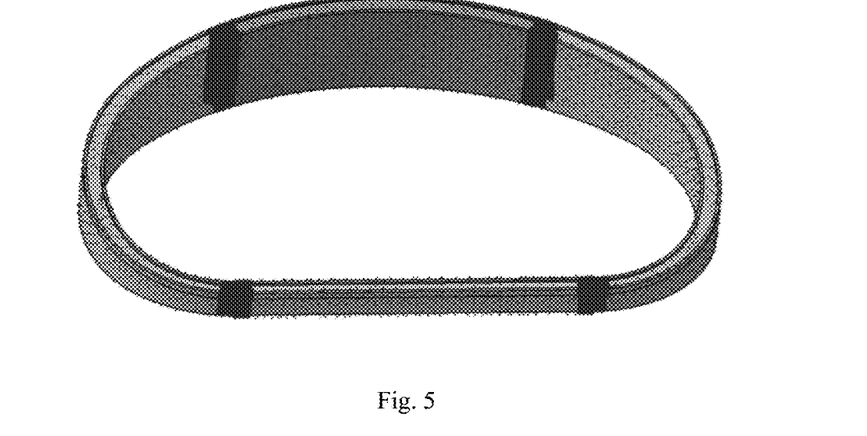
FIG. 5 schematically shows the 3D point cloud data after migrated to the second 3D coordinate system according to an embodiment of the present disclosure.

(2) According to the space conversion solved by the optimal fitting, the data measured by the laser tracker and the measuring arm with the flexible joint coordinates can be converted from the first 3D coordinate system to the second 3D coordinate system. The first 3D coordinate system can be consistent with the second 3D coordinate system to realize the unification of the collected data of each of the poloidal segments. For instance, as shown in FIG. 5, the collected data of the poloidal segments illustrated in FIG. 2 and FIG. 3 can be unified. The space conversion can be a space conversion matrix, which can be applied to the whole data.

(3) Under the second 3D coordinate system, the reverse model reconstruction is performed, and the 3D point cloud data measured by the measuring arm with the flexible joint coordinates and the laser tracker is processed to generate the actual 3D model.

Figure 6:
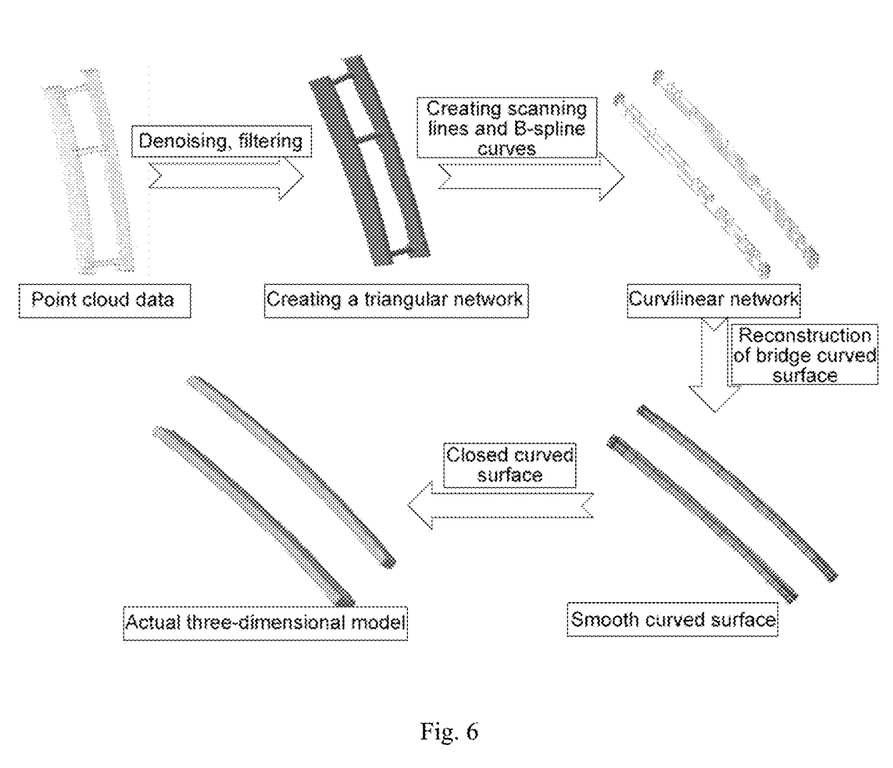
FIG. 6 is a flow chart of processing of the 3D point cloud data according to an embodiment of the present disclosure.

In this embodiment, as shown in FIG. 6, the step of "Under the second 3D coordinate system, the reverse model reconstruction is performed, and the 3D point cloud data measured by the measuring arm with the flexible joint coordinates and the laser tracker is processed to generate the actual 3D model" is performed through the following steps. The 3D point cloud data is processed with denoising and filtering to create a triangular network. Scanning curves and B-spline curves are created in the triangular network to generate a curvilinear network. A bridge curved surface is reconstructed in the curvilinear network to generate a smooth curved surface. The smooth curved surface is processed with a closed curved surface to generate the actual 3D model.

(S103) A cross-reconstruction region between two adjacent poloidal segments is extracted from a sectional view. A target machining allowance of each of the poloidal segments is calculated according to the cross-reconstruction region and a preset segment boundary. A machining strategy for a groove of each of the poloidal segments is generated according to the target machining allowance and a target groove size s. The groove of each of the poloidal segments is machined by using the machining strategy.

The preset segment boundary refers to the segment boundary between adjacent poloidal segments in the ideal 3D model under the second 3D coordinate system.

It should be understood that in this embodiment, the deviation between the actual 3D model and the ideal 3D model can be compared based on reverse engineering technology to complete secondary distribution of the machining allowance of each of the poloidal segments in the vacuum chamber and design grooves on the actual 3D model. For example, grooves can be designed on the actual 3D model to output a machining model, then the grooves are machined according to the machining model by using a machine tool, which can eliminate the contour errors of the actual manufacturing poloidal segments and ensure the machining precision of groove welding. The machining of the grooves can use a floor-type boring and milling machine, gantry milling, and other machining methods.

In this embodiment, the target machining allowance of each of the poloidal segments is calculated as follows.

A total machining allowance is calculated based on an area of the cross-reconstruction region. If the preset segment boundary locates in the cross-reconstruction region, an area ratio of two sub-regions divided by the preset segment boundary in the cross-reconstruction area is calculated, and the target machining allowance of each of the poloidal segments according to the area ratio and the total machining allowances is calculated. If the preset segment boundary is outside the cross-reconstruction region, the total machining allowance is distributed according to a preset distribution strategy to obtain the target machining allowance of each of the poloidal segments.

The larger the area of the cross-reconstruction region is, the larger the machining allowance exists. The actual machining allowance can be determined according to the corresponding relationship between the area of the cross-reconstruction region and the machining allowance.

The preset distribution strategy can be set according to the actual situation, which is not limited specifically. For example, a preset distribution strategy is described as follows. The distribution ratio of one of two adjacent poloidal segments near the preset segment boundary is greater than that of the other poloidal segment. As shown in FIG. 4, the preset segment boundary is located above the cross-reconstruction region and near the poloidal segment 2, therefore the machining allowance of the poloidal segment 2 is greater than that of the poloidal segment 3, for instance, the machining allowance distributed to the poloidal segment 2 can be 80% and that to the poloidal segment 3 can be 20%.

As shown in FIG. 4, as the four poloidal segments are all under the same coordinate system, after the reverse model reconstructions of the end face of each of the poloidal segments is completed, the actual 3D model and the ideal 3D model of each end face can be compared and analyzed to compare the machining allowance of the actual 3D model and the ideal 3D model of each of the poloidal segments.

In this embodiment, the step of "A machining strategy for a groove of each of the poloidal segments is generated according to the target machining allowance and a target groove sizes." is performed through the following steps. A difference between actual machining allowances of adjacent poloidal segments is calculated. If the difference is greater than a preset value, the preset segment boundary is corrected according to the difference, where a corrected preset segment boundary is close to a poloidal segment with a larger actual machining allowance. A groove machining parameter of each of the poloidal segments is generated according to the corrected preset segment boundary and the target groove size, where a portion to be cut at an end face of one poloidal segment with a larger actual machining allowance is larger than a portion to be cut at an end face of the other poloidal segment with a smaller actual machining allowance.

The preset value can be set or calibrated according to the actual situation, which is not limited specifically.

It should be understood that in this embodiment, through the cross-reconstruction region and the comparison of the preset segment boundary, the machining allowance and the adjustment of the preset segment boundary can be determined to improve the accuracy of groove machining.

In this embodiment, the actual machining allowance between adjacent poloidal segments determines whether the preset segment boundary needs to be corrected. For example, as shown in FIG. 4, as the machining allowance of an inner shell in poloidal segment 2 is large and that in the poloidal segment 3 is negative, the preset segment boundary can be shifted toward the poloidal segment 2. As a result, the correction of the preset segment boundary can promote the accuracy of groove machining. After the secondary distribution of the machining allowance, the groove is designed based on the actual 3D model to output a model. The groove of each of the poloidal segments can be machined via a machining tool based on the model with a machining precision of better than 0.5 mm.

In the method, the actual 3D model of the vacuum chamber of the fusion reactor obtained by reverse model reconstruction can contribute to accurately determining the machining allowance of individual poloidal segments to achieve the secondary distribution of the machining allowance. Moreover, the groove can be redesigned according to the machining allowance of the poloidal segment to eliminate the effect of contour error on the machining precision during the manufacturing process of the poloidal segments, which can effectively improve the machining precision of groove welding. A device for machining a groove of poloidal segments of a vacuum chamber of a fusion reactor is provided.

Figure 7:
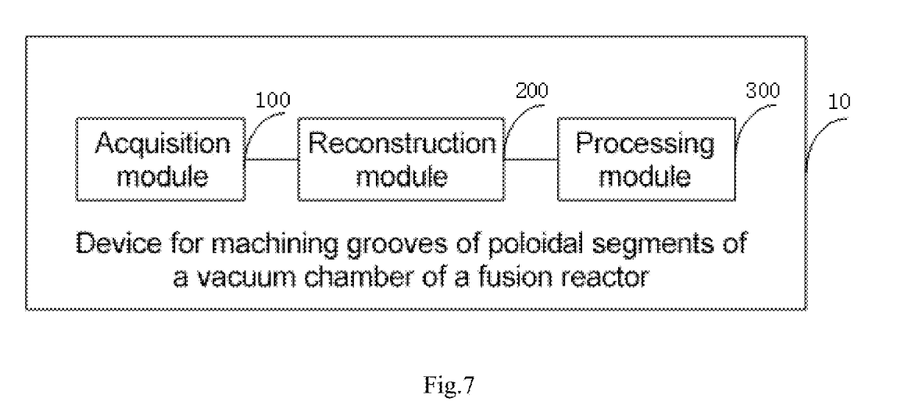
FIG. 7 is a block diagram of a device for machining grooves of the poloidal segments of the vacuum chamber of the fusion reactor according to an embodiment of the present disclosure.

As shown in FIG. 7, the device 10 includes an acquisition module 100, a reconstruction module 200, and a processing module 300.

The acquisition module 100 is configured to acquire a 3D point cloud data of a surface of each of the poloidal segments. The reconstruction module 200 is configured to perform reverse model reconstruction based on the 3D point cloud data to generate the actual 3D model of the vacuum chamber of the fusion reactor and obtain a sectional view of the vacuum chamber of the fusion reactor according to the actual 3D model. The processing module 300 is configured to extract the cross-reconstruction region between adjacent poloidal segments from the sectional view, calculate a target machining allowance of each of the poloidal segments according to the cross-reconstruction region and a preset segment boundary, and generate a machining strategy for each of the poloidal segments according to the target machining allowance and a target groove size s to machine the groove of each of the poloidal segments.

In some embodiments, the processing module 300 includes a distribution unit and a generation unit. The distribution unit is configured to calculate a total machining allowance based on an area of the cross-reconstruction region. The distribution unit is also configured to calculate an area ratio of two sub-regions in the cross-reconstruction region divided by the preset segment boundary if the preset segmenting boundary falls in the cross-reconstruction region, and the target machining allowance of each of the poloidal segments is calculated according to the area ratio and the total machining allowance. If the preset segment boundary is outside the cross-reconstruction region to obtain the target machining allowance of each of the poloidal segments. The generation unit is configured to calculate a difference between actual machining allowances of adjacent poloidal segments. The generation unit is also configured to correct the preset segment boundary according to the difference if the difference is greater than a preset value, where a corrected preset segment boundary is close to a poloidal segment with a larger actual machining allowance. the generation unit is also configured to generate a groove machining parameter of each of the poloidal segments according to the corrected preset segment boundary and the target groove size of each of the poloidal segments, where a portion to be cut on an end face of one poloidal segment with a larger actual machining allowance is larger than a portion to be cut on an end face of the other poloidal segment with a smaller actual machining allowance.

In some embodiments, the acquisition module is also configured to collect a 3D point cloud data of a side face of each of the poloidal segments under a first 3D coordinate system, where the first 3D coordinate system is a coordinate system of a laser tracker; the surface of each of the poloidal segments is composed of an end face and the side face. The acquisition module is also configured to collect a 3D point cloud data of the end face of each of the poloidal segments by using a measuring arm, and convert the 3D point cloud data of the end face of each of the poloidal segments to the first 3D coordinate system according to a common reference point calibrated between the measuring arm and the laser tracker.

In some embodiments, the reconstruction module 200 is configured to establish a second 3D coordinate system in a design software, generate an ideal 3D model of the vacuum chamber of the fusion reactor in the design software, perform relationship matching between the 3D point cloud data of the surface of each of the poloidal segments and the ideal 3D model until a relationship matching result meets a target convergence accuracy to obtain an optimal fitting relationship, convert the 3D point cloud data of the surface of each of the poloidal segments to the second 3D coordinate system by using the optimal fitting relationship, and perform reverse model reconstruction on each of the poloidal segments in the second 3D coordinate system to generate the actual 3D model of the vacuum chamber of the fusion reactor.

It should be noted that the above explanation of the method is also applicable to the device provided herein, which will not be repeated here.

In the device provided herein, the actual 3D model of the vacuum chamber of the fusion reactor obtained by reverse model reconstruction can contribute to accurately determining the machining allowance of individual poloidal segments to achieve the secondary distribution of the machining allowance. Moreover, the groove can be redesigned according to the machining allowance of the poloidal segment to eliminate the effect of contour error on the machining precision during the manufacturing process of the poloidal segments, which can effectively improve the machining precision of groove welding.

Figure 8:
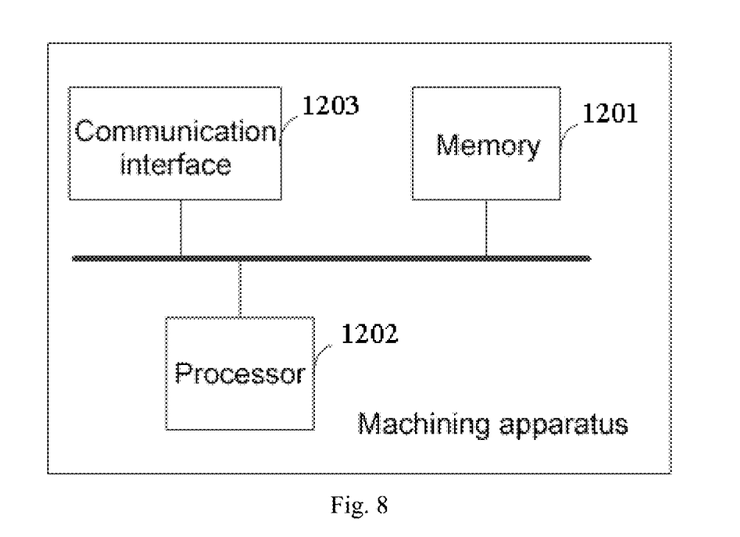
FIG. 8 schematically shows a structure of a machining apparatus according to an embodiment of the present disclosure.

Referring to FIG. 8, an apparatus for machining a groove of poloidal segments of a vacuum chamber of a fusion reactor is provided, which includes a memory 1201, a processor 1202, and a computer program, where the computer program is stored in the memory 1201 and is configured to be executable on the processor 1202; and the processor 1202 is configured to execute the computer program to implement the method for machining a groove of the poloidal segments of a vacuum chamber of a fusion reactor.

In some embodiments, the apparatus further includes a communication interface 1203, where the communication interface 1203 is configured to communicate the memory 1201 with the processor 1202; and the memory 1201 may include a fast random-access memory (RAM), or a non-volatile memory, such as at least one disk memory.

If the memory 1201, the processor 1202, and the communication interface 1203 are independent, the communication interface 1203, the memory 1201, and the processor 1202 can be connected and communicated through a bus. The bus can be an industry-standard architecture (ISA) bus, a peripheral component (PCI) bus, or an extended industry standard architecture (EISA) bus. The bus can be classified into an address bus, data bus, control bus, and so on. For ease of representation, a single thick line is configured to illustrate the bus, as shown in FIG. 12, but it does not mean that there is only one bus or one type of bus.

In some embodiments, if the memory 1201, the processor 1202, and the communication interface 1203 are integrated on a chip, the memory 1201, the processor 1202, and the communication interface 1203 are communicated through an internal interface.

The processor 1202 can be a central processing unit (CPU), or an application-specific integrated circuit (ASIC), or one or more integrated circuits configured to implement the embodiments of this application.

A computer-readable storage medium is also provided herein, where the computer-readable storage medium stores a computer program; and the computer program is configured to be executed by a processor to implement the method for machining a groove of poloidal segments of a vacuum chamber of a fusion reactors as described above.

As used herein, the reference terms "one embodiment", "embodiments", "examples", "specific examples", and "some examples" mean that the specific features, structures, materials, or characteristics described herein are contained in at least one embodiment or example of this application. The indicative representations of the above terms are not necessarily specific to the same embodiments or examples. Furthermore, the specific features, structures, materials or characteristics described herein can be combined in any one or N embodiments or examples in an appropriate manner. In addition, without contradiction, different embodiments or examples and the characteristics of the different embodiments or examples can be combined by those skilled in the art.

Furthermore, the terms "first" and "second" are only intended to describe and do not necessarily require or imply that there is any relative importance or the number of technical features. Thus, features that are limited with the term "first" or "second" may include, explicitly or implicitly, at least one of these features. The term "N" means at least two (such as two, three, etc.), unless otherwise expressly specified.

Flow charts or any process or method description described in other ways include one or N modules, fragments, or parts of the codes of the executable instructions configured to implement a custom logic function or process steps. Moreover, it should be understood by those skilled in the art that the preferred modes of the implementation can perform functions without being in the order shown or discussed, including a simultaneous manner or reverse order based on the functions involved.

Logic and/or steps represented in the flow charts or otherwise described herein, for example, a fixed list of executable instructions that can be considered to implement logical functions, can be implemented in any computer-readable medium for use by instruction execution systems, devices, or equipment (such as computer-based systems, including processor systems, or other systems that can read and execute instructions from, or other devices in combination with these instruction execution systems, devices, or equipment. As used herein, computer-readable media can be any device that may contain store, communicate, propagate, or transmit programs for the execution of a system, device, or equipment, or other devices in combination with these instruction execution systems, devices, or equipment. computer-readable media include electrical connecting part (electronic device) with one or N cabling, laptop enclosure (magnetic device), random access memory (RAM), read-only memory (ROM), erasable read-only memory (EPROM or flash memory), fiber optic device, and portable compact disc read-only memory (CDROM). Furthermore, computer-readable media can even be paper or other suitable media on which the program can be printed. For example, by optical scanning on paper or other media, followed by editing, interpretation, or other appropriate processing to obtain the program electronically and then store it in a memory.

It should be understood that the various parts of this application can be implemented with hardware, software, firmware, or a combination thereof. In the above embodiments, N steps or methods can be implemented using software or firmware stored in a memory and executed by the appropriate instruction execution system. If N steps or methods are be implemented using a hardware, it can be achieved by a discrete logic circuit with logic gate circuits that can endow data signals logic gate function, a special integrated circuit with suitable combination logic gate circuits, a programmable door array (PGA), a field-programmable door array (FPGA), or a combination thereof.

It should be understood by those skilled in the art that all or part of the steps disclosed in the above embodiments can be performed by a program to instruct the relevant hardware. The program can be stored in a computer-readable storage medium, the program includes one of the steps or a combination thereof.

Furthermore, functional units in the embodiments of this application can be integrated into a processing module, or are independent, or two or more units can be integrated into a single module. The above-mentioned integrated modules can be implemented either in the form of hardware or in the form of software function modules. The integrated modules can also be stored in a computer-readable storage medium if they are implemented in the form of software function modules and sold or used as an independent product.

The above-mentioned storage media can be a read-only memory, a disk, or a compact disc. Although the embodiments of the disclosure have disclosed and described above, it should be understood that these embodiments are merely exemplary and are not intended to limit this application. Various modifications, changes, replacements, and variations made by those skilled in the art without departing from the scope of the disclosure should fall within the scope of the disclosure defined by the appended claims.

What is claimed is:

1. A method for machining a groove of poloidal segments of a vacuum chamber of a fusion reactor, comprising:
   collecting three-dimensional (3D) point cloud data of a surface of individual poloidal segments of the vacuum chamber of the nuclear fusion reactor;
   performing a reverse model reconstruction based on the three-dimensional point cloud data,
   to generate an actual 3D model of the vacuum chamber of the fusion reactor; and
   acquiring a sectional view of the vacuum chamber of the fusion reactor according to the actual 3D model; and
   extracting a cross-reconstruction region between two adjacent poloidal segments from the sectional view;
   calculating a target machining allowance of each of the poloidal segments according to the cross-reconstruction region and a preset segment boundary;
   generating a machining strategy for the groove of each of the poloidal segments according to the target machining allowance and a target groove size; and
   machining the groove of each of the poloidal segments by using the machining strategy.

2. The method of claim 1,
   wherein the step of "calculating the target machining allowance of each of the poloidal segments according to the cross-reconstruction region and the preset segment boundary" is performed through steps of:
   calculating a total machining allowance based on an area of the cross-reconstruction region;
   if the preset segment boundary locates in the cross-reconstruction region,
   calculating an area ratio of two sub-regions divided by the preset segment boundary in the cross-reconstruction region; and
   calculating the target machining allowance of each of the poloidal segments according to the area ratio and the total machining allowance; and
   if the preset segmenting boundary is outside the cross-reconstruction region,
   distributing the total machining allowance according to a preset distribution strategy to obtain the target machining allowance of each of the poloidal segments.

3. The method of claim 1,
   wherein the step of "generating the machining strategy for each of the poloidal segments according to the target machining allowance and the target groove size" is performed through steps of:
   calculating a difference between actual machining allowances of adjacent poloidal segments;
   if the difference is greater than a preset value,
   correcting the preset segment boundary according to the difference;
   wherein a corrected preset segment boundary is close to the poloidal segment with a larger actual machining allowance; and
   generating a groove machining parameter of each of the poloidal segments according to the corrected preset segment boundary and the target groove size;
   wherein a portion to be cut at an end face of one poloidal segment with the larger actual machining allowance is larger than the portion to be cut at the end face of the other poloidal segment with a smaller actual machining allowance.

4. The method of claim 1,
   wherein the step of "collecting the three-dimensional (3D) point cloud data of a surface of the individual poloidal segments of a vacuum chamber of the fusion reactor" is performed through steps of:
   taking a coordinate system of a laser tracker as a first 3D coordinate system; and
   collecting a 3D point cloud data of the end face of each of the poloidal segments by using a measuring arm; and
   wherein the surface of the individual poloidal segments is composed of an end face and the side face;
   collecting the 3D point cloud data of the end face of each of the poloidal segments by using the measuring arm; and
   converting the 3D point cloud data of the end face of each of the poloidal segments to the first 3D coordinate system according to a common reference point calibrated between the measuring arm and the laser tracker.

5. The method of claim 1,
wherein the step of "performing the reverse model reconstruction,
based on the three-dimensional point cloud data,
to generating the actual 3D model of the vacuum chamber of the fusion reactor" is performed through steps of:
establishing a second 3D coordinate system in a design software; and
generating an ideal 3D model of the vacuum chamber of the fusion reactor in the design software;
performing relationship matching between the 3D point cloud data of the surface of each of the poloidal segments and the ideal 3D model until a relationship matching result meets a target convergence accuracy to obtain an optimal fitting relationship between the 3D point cloud data of the surface of each of the poloidal segments and the ideal 3D model; and
converting the 3D point cloud data of the surface of each of the poloidal segments to the second 3D coordinate system according to the optimal fitting relationship; and
performing model reverse reconstruction on each of the poloidal segments under the second 3D coordinate system to generate the actual 3D model of the vacuum chamber of the fusion reactor.

\* \* \* \* \*